(12) United States Patent
Shen et al.

(10) Patent No.: US 6,507,070 B1
(45) Date of Patent: Jan. 14, 2003

(54) SEMICONDUCTOR DEVICE AND METHOD OF MAKING

(75) Inventors: Zheng Shen, Chandler; Stephen P. Robb; Chang Su Mitter, both of Tempe, all of AZ (US)

(73) Assignee: Semiconductor Components Industries LLC, Phoenix, AZ (US)

( * ) Notice: Subject to any disclaimer, the term of this patent is extended or adjusted under 35 U.S.C. 154(b) by 749 days.

(21) Appl. No.: 08/755,926

(22) Filed: Nov. 25, 1996

(51) Int. Cl.[7] ............. H01L 29/76; H01L 29/94; H01L 31/062; H01L 31/113
(52) U.S. Cl. .................. 257/341; 257/344
(58) Field of Search .................. 257/146, 147, 257/148, 149, 150, 151, 156, 157, 344, 341, 139, 263

(56) References Cited

U.S. PATENT DOCUMENTS

| | | | | |
|---|---|---|---|---|
| 4,079,504 A | * | 3/1978 | Kosa | 257/394 |
| 4,716,446 A | * | 12/1987 | Esser et al. | 257/341 |
| 4,717,940 A | * | 1/1988 | Shinohe et al. | 257/152 |
| 4,799,098 A | * | 1/1989 | Ikeda et al. | 257/370 |
| 4,887,135 A | * | 12/1989 | Cheney et al. | 257/306 |
| 4,914,043 A | * | 4/1990 | Nishizawa et al. | 257/136 |
| 4,942,444 A | * | 7/1990 | Ablassmeier | 257/146 |
| 5,191,401 A | * | 3/1993 | Shirai et al. | 257/344 |
| 5,256,893 A | * | 10/1993 | Yasuoka | 257/341 |
| 5,393,999 A | * | 2/1995 | Malhi | |
| 5,420,451 A | | 5/1995 | Williams et al. | |
| 5,430,316 A | * | 7/1995 | Contiero et al. | 257/341 |
| 5,528,058 A | * | 6/1996 | Pike et al. | 257/142 |
| 5,648,673 A | * | 7/1997 | Yasuda | 257/382 |

FOREIGN PATENT DOCUMENTS

| | | | | |
|---|---|---|---|---|
| EP | 0356039 | * | 2/1990 | 257/336 |
| EP | 0520831 | * | 12/1992 | 257/147 |
| JP | 51-85381 | * | 7/1976 | 257/288 |
| JP | 60-251669 | * | 12/1985 | 257/386 |
| JP | 06204463 | * | 7/1994 | 257/147 |

OTHER PUBLICATIONS

Williams et al., Siliconix, Inc., Proceedings of 1995 International Symposium on Power Semiconductor Devices & ICs. Yokohama, "The Bidirectional Power NMOS– A New Concept in Battery Disconnect Switching", pp. 480–485.

* cited by examiner

*Primary Examiner*—Phat X. Cao

(57) ABSTRACT

A semiconductor device (10) is formed that is bi-lateral and has a voltage blocking capability that is well suited to applications involving portable electronics. The semiconductor device has an epitaxial layer (14) that is formed on a semiconductor substrate (11). A doped region (24) is formed that extends from a top surface (16) of the epitaxial layer (14) to the underlying semiconductor substrate (11). The semiconductor device (10) has a source region (31) that is separated from the doped region (24) to provide a channel region (29). The channel region (29) is modulated by a gate structure (20) to determine if a current flow should be allowed through semiconductor device (10) or if semiconductor device (10) is to provide voltage blocking capability.

1 Claim, 2 Drawing Sheets

SEMICONDUCTOR DEVICE AND METHOD OF MAKING

BACKGROUND OF THE INVENTION

The present invention relates, in general, to semiconductor devices, and more particularly to semiconductor devices having bi-directional current blocking capability.

Many portable electronic devices use a lithium-ion battery as a power source. Lithium-ion batteries require a monitoring circuit to control the flow of current when the lithium-ion battery is used as a power source and when the lithium-ion battery is being charged. When in operation, the voltage potential across the battery must be monitored to ensure that the voltage potential of the lithium battery does not drop too low. If the lithium-ion battery is operated when the voltage potential of the battery is too low, the future performance of the lithium-ion battery can be degraded. Furthermore, lithium-ion batteries are very sensitive to the amount of current that passes through the battery when it is being charged.

Therefore, lithium batteries require a monitoring circuit that is both bilateral, allows current to flow in both directions, and that can withstand significant voltages while current is blocked in either direction. One way of providing this functionality is to place two n- or p-channel vertical field effect transistors in a back-to-back configuration so that they share a common source/drain.

Using two transistors in a back-to-back configuration has several disadvantages. Firstly, the channel region of two devices results in a higher on resistance in the current path. Secondly, the formation of two devices in a back-to-back configuration requires significant surface area, which results in a high die cost and an higher overall manufacturing cost.

Accordingly, a need exists to provide a semiconductor device that can operate bi-directionally and provide the necessary voltage protection when a lithium battery is in operation and when it is being charged. It would be advantageous if the semiconductor device can be formed using less surface area than traditional devices and using fewer processing steps.

Figure 1:
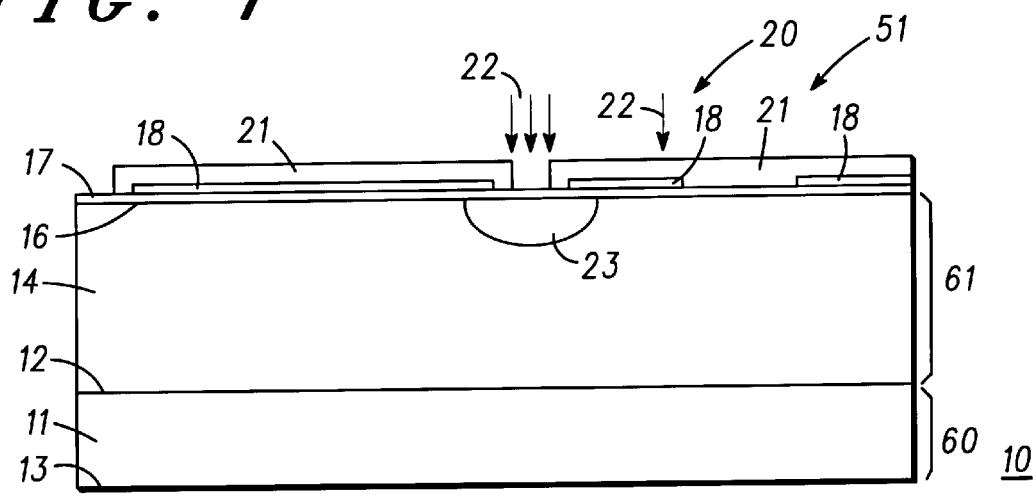
FIGS. 1–4 are enlarged cross-sectional views of a semiconductor device at various stages of manufacture in accordance with the present invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION OF THE DRAWINGS

FIG. 1 is an enlarged cross-sectional view of a semiconductor device 10 at an early step in the manufacturing process. A method for fabricating semiconductor device 10 in accordance with the present invention will now be provided in an n-channel configuration. This is not intended as a limitation as those skilled in art will appreciate, a p-channel configuration is achieved by converting p-type regions to n-type regions and vice versa.

Semiconductor device 10 is formed on a semiconductor substrate 11 that has a top surface 12 and a bottom surface 13. Semiconductor substrate 11 is of n-type conductivity and preferably has a thickness 60 ranging from about 100 microns to 600 microns and has a resistivity ranging from about 0.0005 ohm-cm to about 0.01 ohm-cm. In the preferred embodiment, semiconductor substrate 11 is a silicon substrate, but it should be understood that other semiconductor materials may also be used.

A layer of semiconductor material, preferably an epitaxial layer 14, is formed on the top surface 12 of semiconductor substrate 11. Any conventional deposition process can be used to form epitaxial layer 14, and preferably, epitaxial layer 14 has a thickness 61 ranging from about 1 micron to 10 microns and a resistivity of about 1 ohm-cm to 10 ohm-cm. As epitaxial layer 14 is deposited, it is doped to a p-type conductivity.

A gate dielectric layer 17 is formed on a top surface 16 of epitaxial layer 14. Preferably, gate dielectric layer 17 comprises silicon dioxide with a thickness in the range from about 150 angstroms to 1,000 angstroms. A gate layer 18 is formed on a portion of gate dielectric layer 17. Gate layer 18 typically comprises a semiconductor layer such as a polysilicon layer. By way of example, gate layer 18 has a thickness of about 3,000 angstroms.

A conventional masking and wet etch process is used to pattern gate layer 18 as shown in FIG. 1. A portion of gate layer 18 together with the underlying portion of gate dielectric layer 17 form a gate structure 20. Gate structure 20 is used to modulate an underlying channel region when semiconductor device 10 is in operation. The details of this operation are provided below.

A first masking layer 21 is formed over the top surface 16 and is patterned to provide a window that exposes a portion of gate dielectric layer 17. First masking layer 21 is for example, a thick (e.g., 1.0 micron) photoresist layer, a dielectric layer, or the like. After masking layer 21 is formed, an n-type doped region 23 is formed by ion implanting an n-type dopant such as arsenic or phosphorus into the exposed portion of gate dielectric layer 17, indicated in FIG. 1 with arrows 22. Preferably, the implant is at an angle of zero degrees (i.e., semiconductor substrate 11 is perpendicular to the ion beam). A phosphorus dose of about $5.0 \times 10^{15}$ atoms/cm$^2$ to $1.0 \times 10^{17}$ atoms/cm$^2$ and an implant energy of about 50 keV to 150 keV is suitable to provide n-type implant region 23. Masking layer 21 is then removed using appropriate techniques to allow further processing.

Figure 2:
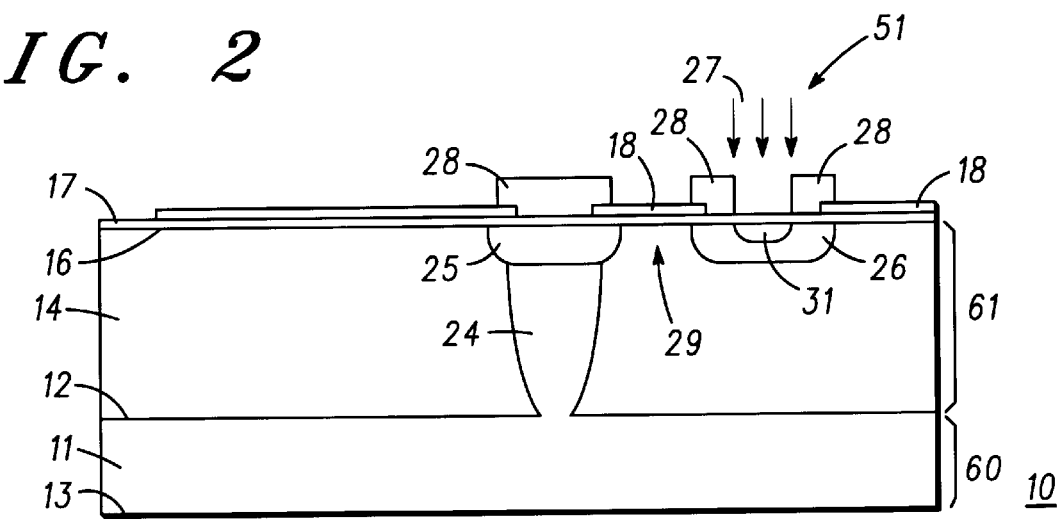

FIG. 2 is an enlarged cross-sectional view of semiconductor device 10 after further processing. Semiconductor substrate 11 is heated to activate the dopant of n-type doped region 23 (see FIG. 1). For example, semiconductor substrate 11 is heated to about 950° C. to 1150° C. for about 15 minutes to 60 minutes. The anneal process enlarges the shape of n-type doped region 23 to form an n-type doped region 24 as shown in FIG. 2. As shown, n-type doped region 24 extends from top surface 16 of epitaxial layer 14 to semiconductor substrate 11. Preferably, n-type doped region 24 has a peak dopant concentration of about $5.0 \times 10^{15}$ atoms/cm$^3$ to $1.0 \times 10^{17}$ atoms/cm$^3$. As shown below, n-type doped region 24 provides a low-resistance path for a current flow through epitaxial layer 14.

A second implant step is performed to formed lightly doped regions 25 and 26. The remaining portions of gate layer 18 on gate dielectric layer 17 provide a hard mask for this implant step. A phosphorus dose of about $5.0 \times 10^{12}$ atoms/cm$^2$ to $1.0 \times 10^{14}$ atoms/cm$^2$ and an implant energy of about 30 keV to 70 keV is suitable to provide lightly doped regions 25 and 26. Following the implant process, an anneal at about 850° C. to 950° C. for about 15 minutes to 30 minutes is performed to form lightly doped regions 25 and 26 as shown in FIG. 2. Lightly doped regions 25 and 26 are of n-type conductivity and define a channel region 29 under gate structure 20. The length of channel region 29 of semiconductor device 10 is defined as the distance between lightly doped regions 25 and 26 and is preferably about 0.5 microns to 5 microns.

A second masking layer 28 is then formed over top surface 16. Second masking layer 28 is patterned to expose a portion of gate dielectric layer 17 over lightly doped region 26. Second Masking layer 28 is for example, a thick (e.g., 1.0 micron) photoresist layer, a dielectric layer, or the like. An implantation step is then used to form a source region 31. Source region 31 is formed by ion implanting with an n-type dopant such as arsenic or phosphorus into top surface 16, preferably at an angle of zero degrees. An arsenic dose of about $5.0 \times 10^{14}$ atoms/cm$^2$ to $1.0 \times 10^{16}$ atoms/cm$^2$ and an implant energy of about 30 keV to 150 keV is suitable to provide source region 31. After second masking layer 28 is removed, a second anneal step can be performed to achieve the desired doping profile depth and to activate the implanted dopant.

A threshold adjust implant is performed to adjust the threshold voltage of semiconductor device 10. A light blanket boron dose of about $5.0 \times 10^{12}$ atoms/cm$^2$ to $1.0 \times 10^{13}$ atoms/cm$^2$ and an implant energy of about 30 keV to 150 keV is suitable to provide the necessary threshold voltage control.

Figure 3:
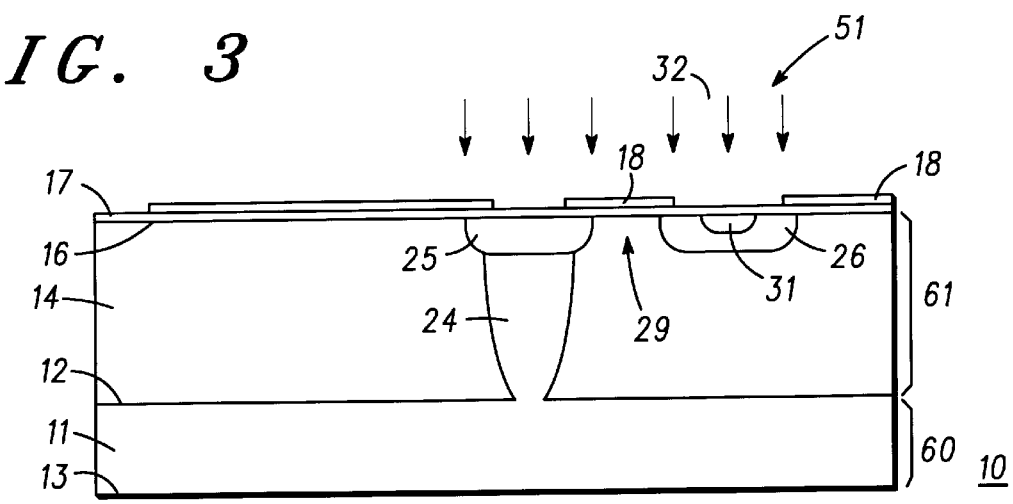

FIG. 3 is an enlarged cross-sectional view of semiconductor device 10 and is provided to illustrate an optional step in accordance with the present invention. Using the remaining portions of gate layer 18 as a hard mask, a blanket titanium implant may be performed to reduce the lifetime of carriers within lightly doped regions 25 and 26. A titanium implant dose of about $1.0 \times 10^{13}$ atoms/cm$^2$ to $5.0 \times 10^{15}$ atoms/cm$^2$ and an implant energy ranging from about 50 keV to 400 keV. The implant process is indicated in FIG. 3 with arrows 32.

Figure 4:
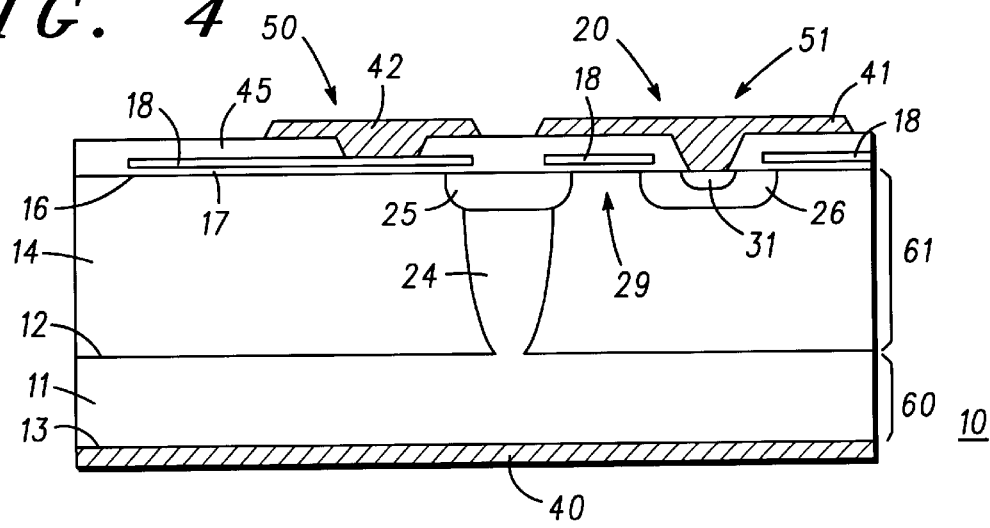

FIG. 4 is an enlarged cross-sectional view of semiconductor device 10 after further processing. An insulating layer 45 is formed over gate layer 18 and the exposed portions of gate dielectric layer 17. Insulating layer 45 can be a layer of silicon dioxide or silicon nitride that is formed using a conventional chemical vapor deposition (CVD) or plasma enhanced chemical vapor deposition (PECVD) process. An additional masking layer (not shown) is then formed and patterned over insulating layer 45. A wet etch or reactive ion etch (RIE) process is used to form openings 50 and 51 in insulating layer 45.

Electrical contacts 40, 41, and 42 are then formed to provide electrical connection to the drain, source, and gate terminals of semiconductor device 10. Two separate metallization deposition processes can be used to form the necessary electrical connections. For example, a layer of aluminum or aluminum alloy is sputtered onto insulating layer 45 and then onto the bottom surface 13 of semiconductor substrate 11. The portion of the metal layer on insulating layer 45 is patterned using a conventional masking and RIE etch process. Because the bottom surface 13 of semiconductor substrate 11 is a drain contact, there is no need to perform a separate pattern and etch process to form a backside contact. It should be appreciated that gate structure 20 is electrically connected to electrical contact 42 by a portion of gate layer 18 that is not shown in FIG. 4.

Semiconductor device 10 is a bi-directional device in that it allows a current to flow from either a drain terminal (semiconductor substrate 11) to a source terminal (doped region 31) or vice versa when enabled by gate structure 20. Furthermore, semiconductor device 10 has a blocking voltage capability of about 15 to 30 volts when semiconductor device 10 is not enabled. In other words, when semiconductor device 10 is turned off (i.e. no voltage potential on gate structure 20), semiconductor device 10 will not avalanche when there is a voltage potential of up to 30 volts (i.e., at least 30 volts) between the source and drain terminals. This capability is due in part to the thickness of epitaxial layer 14, the doping and placement of doped regions 24–26, and the presence of titanium dopant in doped regions 25 and 26. When semiconductor device is turned on by placing a voltage potential on gate structure 20 and channel region 29 is conducting, a current can flow along a current path from doped region 26, through channel region 29, through doped regions 24 and 25, and to semiconductor substrate 11. In this condition, doped region 24 and doped region 25 are essentially at a same voltage potential.

A semiconductor device made in accordance with the present invention, has the advantage in that it can be formed in significantly less surface area than back-to-back devices that provide similar functionality. This is because semiconductor device 10 requires generally half the channel region area of conventional back-to-back devices. Therefore, the semiconductor device of the present invention can be formed in half of the area as previously known devices. Moreover, the present invention does not require the use of a double-metal process to form the necessary electrical connections. This will significantly reduce the manufacturing cost of the semiconductor device of the present invention when compared to traditional device.

In addition, the present invention also offers a significant performance advantage over back-to-back devices. Because the device is generally half as small as traditional devices, it has an "on-resistance" that is half that of conventional devices. This coupled with the savings in die size, provides a performance advantage that is significantly greater than conventional back-to-back devices.

What is claimed is:

1. A semiconductor device, comprising:
   a semiconductor substrate of a first conductivity type, wherein the semiconductor substrate has a top surface and a bottom surface;
   an epitaxial layer of a second conductivity type overlying the top surface of the semiconductor substrate and having a top surface;
   a first doped region in the epitaxial layer, wherein the first doped region is doped to the first conductivity type and contacts the semiconductor substrate, and wherein the first doped region is electrically isolated from the epitaxial layer by a PN junction;
   a second doped region in the epitaxial layer, wherein the second doped region is doped to the first conductivity type, extends from the top surface of the epitaxial layer, and overlaps at least a portion of the first doped region, and wherein the second doped region is electrically isolated from the epitaxial layer by a PN junction;
   a third doped region in the epitaxial layer, wherein the second doped region and the third doped region comprise titanium, wherein the third doped region is doped to the first conductivity type and extends from the top surface of the epitaxial layer, wherein the third doped region is electrically isolated from the epitaxial layer by a PN junction and is separated from the second doped region by a first distance to provide a channel region, wherein the channel region is electrically floating such that the channel region prevents the flow of current between the first doped region and the third doped region if the third doped region is at a voltage potential that is at least 30 volts higher than the first doped region, and the channel region prevents the flow of current between the first doped region and the third doped region if the first doped region is at a voltage potential that is at least 30 volts higher than the third doped region; and a gate structure overlying at least a portion of the channel region and at least a portion of the second doped region.

* * * * *